United States Patent
Chen et al.

(10) Patent No.: US 7,612,703 B2
(45) Date of Patent: Nov. 3, 2009

(54) PIPELINED ANALOG-TO-DIGITAL CONVERTER WITH CALIBRATION OF CAPACITOR MISMATCH AND FINITE GAIN ERROR

(75) Inventors: Cheng Chen, Shanghai (CN); Jiren Yuan, Lund (SE)

(73) Assignee: Emensa Technology Ltd. Co., Shanghai (CN)

( * ) Notice: Subject to any disclaimer, the term of this patent is extended or adjusted under 35 U.S.C. 154(b) by 0 days.

(21) Appl. No.: 12/136,226

(22) Filed: Jun. 10, 2008

(65) Prior Publication Data

US 2009/0189796 A1    Jul. 30, 2009

(30) Foreign Application Priority Data

Jan. 24, 2008    (CN) ..................... 2008 1 0033030

(51) Int. Cl.
H03M 1/12    (2006.01)
(52) U.S. Cl. .................. 341/172; 341/120; 341/161
(58) Field of Classification Search .......... 341/161, 341/172, 162, 122, 120, 118, 155
See application file for complete search history.

(56) References Cited

U.S. PATENT DOCUMENTS

| | | | |
|---|---|---|---|
| 6,184,809 B1 | 2/2001 | Yu | |
| 6,232,898 B1 | 5/2001 | Nagaraj | |
| 6,563,445 B1 | 5/2003 | Sabouri | |
| 6,784,814 B1 | 8/2004 | Nair et al. | |
| 6,963,300 B1 * | 11/2005 | Lee | 341/172 |
| 7,233,276 B1 | 6/2007 | Huang | |
| 7,355,476 B2 * | 4/2008 | Kasha et al. | 330/284 |

* cited by examiner

Primary Examiner—Peguy JeanPierre
(74) Attorney, Agent, or Firm—Hamre, Schumann, Mueller & Larson

(57) ABSTRACT

The present invention relates to an analog-to-digital converter, especially to a pipelined analog-to-digital converter with calibration of capacitor mismatch and finite gain error. Comparing with the conventional pipelined analog-to-digital converter, the new analog-to-digital converter comprises more circuit blocks including an extra sub-converter stage, a control clock generator and an error detector, resulting in that each sub-converter stage has two operation modes: normal conversion mode and calibration mode. All of the sub-converter stages share one error detector which amplifies the output of the sub-converter stage in calibration mode. Furthermore, to store the output of the error detector, a memory is used in each sub-converter stage for controlling the gain of amplifier in order to make the error generated by the finite gain of amplifier and the error generated by the capacitance mismatch have the same size but opposite sign. As a result, the two errors can compensate each other to achieve an error-free conversion stage.

7 Claims, 4 Drawing Sheets

100

200

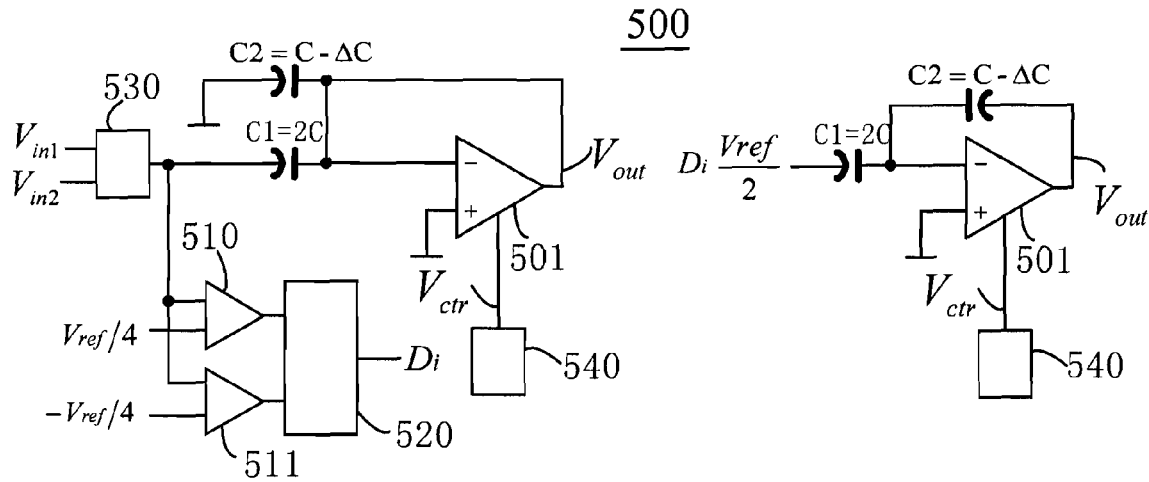
Fig. 5A    Fig. 5B
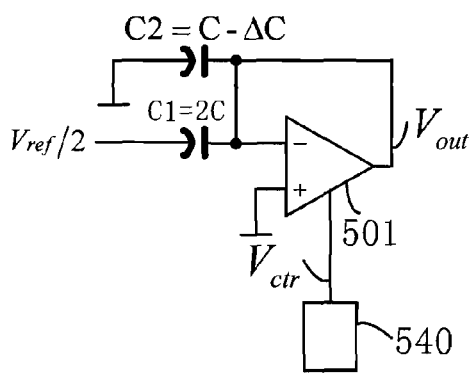 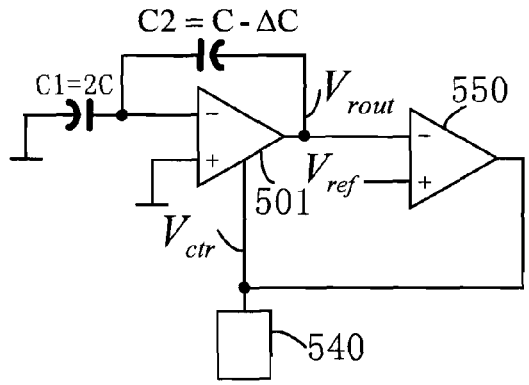
Fig. 5C    Fig. 5D

PIPELINED ANALOG-TO-DIGITAL CONVERTER WITH CALIBRATION OF CAPACITOR MISMATCH AND FINITE GAIN ERROR

BACKGROUND OF THE INVENTION

1. Field of Invention

The present invention relates to an analog-to-digital converter, especially to a pipelined analog-to-digital converter with low-gain amplifiers.

2. Background

An analog-to-digital converter (ADC) is a device that converts an analog signal into a digital code, i.e. "digitizes" the analog signal. In the field of high speed ADCs, the fastest architecture reported to date is flash converter. However, an ADC based on a flash-type will require a huge number of very accurate and fast comparators, which consume large chip area and power. Among various ADC architectures, the pipeline technique is one of the candidates to overcome those drawbacks of the flash-type ADC. Furthermore, the pipeline architecture has been proved that it could provide a better tradeoff among speed, accuracy, power, and chip area than other ADC architectures.

A block diagram of a conventional pipelined ADC with 1.5-bit/stage algorithm is shown in FIG. 1, where the resolution of ADC 100 is, for example, 10 bits (N=10). The ADC 100 consists of an optional sample-and-hold 101, sub-converter stages 102-109, a final flash stage 120, and a digital error correction circuit 130. The optional sample-and-hold 101 samples the input analog signal in sampling phase and then in holding phase generates an analog output which is quantified into a 1.5-bit digital code within the first stage 102. Both the resulting 1.5-bit codes of stages 102-109 and 2-bit code of final stage 120 are sent to the digital block 130 for processing. The 1.5-bit code of each stage is fed back to the stage itself to become an analog representation. The difference between the analog representation and the sampled analog input signal is multiplied by two to produce a residue signal which is sampled by the next stage. Each stage effectively converts only one bit of information and the extra half bit is used for redundancy to relieve the offset requirement of comparators. Digital error correction circuit 130 deals with the redundancy to generate an N-bit digital result.

The circuit diagrams of sub-converter stages 102-109 are identical, as illustrated in FIG. 2A (sampling phase) and FIG. 2B (holding phase). The examples are single-ended but may be differential in practice and the same below. One sub-converter stage 200 comprises an amplifier 201, two capacitors C1 and C2, two comparators 210 and 211, and a digital unit 220. During sampling phase, as shown in FIG. 2A, the output and inverting input of amplifier 201 are connected together with the top plates of both C1 and C2. The non-inverting input of amplifier 201 is connected to a dc voltage, for example, ground. The input analog signal $V_{in}$ is sampled parallelly on the bottom plates of C1 and C2, and further fed to comparators 210 and 211 to compare with two reference voltages, respectively. The digital unit 220 receives the results of the two comparators and provides a digital output $D_i$ (1, 0, or −1). During holding phase, as shown in FIG. 2B, the amplifier 201 is in amplification mode and its inverting input is still connected with the top plates of both C1 and C2. The bottom plate of C2 is connected with the output of amplifier 201. Depending on the value of $D_i$, the bottom plate of C1 is connected with different reference voltages. As a result, the output of amplifier 201 is decided by the input analog signal $V_{in}$, $D_i$, capacitance ratio of C1 and C2, amplifier 201 gain, and reference voltage $V_{ref}$. In order to achieve an ideal multiplication of two of the input analog signal $V_{in}$ for the output $V_{out}$, C1 and C2 should be perfectly matched and the dc gain of amplifier 201 should be infinite.

FIG. 3 is a graph illustrating the ideal transfer characteristics of a 1.5-bit/stage conventional pipelined ADC. The two thresholds or transition points are $V_{ref}/4$ and $-V_{ref}/4$.

In the above-mentioned pipelined architecture, the performance of ADC suffers from both the mismatch of capacitor and the finite amplifier gain. Calibration approaches [1]-[2] have been proposed to compensate the capacitor mismatch. The finite amplifier gain error can be also calibrated [3]-[4]. Moreover, digital calibration procedure [5] corrects both the capacitor mismatch and finite amplifier gain. But these methods are generally difficult to implement, time consuming and/or with additional conversion process steps.

SUMMARY

The present invention is directed to provide a low-power high-speed pipelined ADC with calibration of capacitor mismatch and finite gain error.

The invention is based on the following observation. In a sub-converter stage of a pipelined ADC, if the error generated by the finite amplifier gain and the error generated by the capacitor mismatch have the same size but opposite sign, the two errors can compensate each other to achieve an error-free conversion stage. Such a sub-converter stage comprises an amplifier, a sub analog-to-digital converter with comparators and a digital unit, a first capacitor and a second capacitor. The first capacitor is selectively connected between the analog input node and the amplifier input or between a corresponding plurality of digital reference signals and the amplifier input. The second capacitor is selectively connected between a dc voltage and the amplifier input or between the amplifier input and the amplifier output. The capacitance value 2C of the first capacitor, the capacitance value C−ΔC of the second capacitor, and the dc gain A of the amplifier satisfy an expression:

$$\frac{\Delta C}{C} = \frac{3}{A+1} \qquad (1)$$

where ΔC is the capacitance mismatch. During a sampling phase, the first capacitor is connected between the analog input node and the amplifier input, and the second capacitor is connected between a dc voltage and the amplifier input. During a holding phase, the first capacitor is connected between a corresponding plurality of digital reference signals and the amplifier input, and the second capacitor is connected between the amplifier input and the amplifier output.

In real environment, the capacitance ratio of the first capacitor and the second capacitor is inconstant due to the imperfection of manufacture process and temperature drifting. In order to make (1) always stand, the gain A of the amplifier should be adjustable. As a result, the sub-converter stage needs an error detector and a memory and has two operation modes: normal conversion mode and calibration mode. During a sampling phase of the normal conversion mode, the first capacitor is connected between the analog input node and the amplifier input, and the second capacitor is connected between a dc voltage and the amplifier input. During a holding phase of the normal conversion mode, the first capacitor is connected between a corresponding plurality of digital reference signals and the amplifier input, and the second capacitor is connected between the amplifier input and the amplifier output. During a sampling phase of the calibration mode, the first capacitor is connected between a reference signal Vref /2 and the amplifier input, and the second capacitor is connected between a dc voltage and the amplifier input. During a holding phase of the calibration mode, the first capacitor is connected between a dc voltage and the amplifier input, and the second capacitor is connected between the amplifier input and the amplifier output. The difference between the output of the amplifier and reference signal Vref is detected by the error detector. The output of the error detector is stored in the memory for adjusting the gain of the amplifier to make the equation $$\frac{\Delta C}{C} = \frac{3}{A+1}$$

still stand even when the capacitance ratio of the first capacitor and the second capacitor drifts in real environment.

The pipelined ADC of the present invention comprises a series of above-mentioned sub-converter stages.

In one aspect of the present invention, at least two sub-converter stages in the pipelined ADC are modified to have two operation modes: normal conversion mode and calibration mode. The stage under calibration is removed from the pipeline, and an extra stage is added to keep the normal function of the pipeline. Those stages with two operation modes are calibrated one by one periodically.

In another aspect of the present invention, the amplifier of the modified stage has a low gain, and two customized capacitances are chosen for the stage to fit the low amplifier gain. Moreover, during the calibration mode, the amplifier gain is adjusted through a feedback loop to match the ratio variation of the two capacitors due to imperfect manufacturing process and variable temperature.

According to the above theory, a block diagram of the embodiments is shown in FIG. 4. Comparing with the conventional ADC illustrated in FIG. 1, the new ADC comprises one more sub-converter stage and an extra control clock generator. This means that besides an optional sample-and-hold, sub-converter stages from stage-1 to stage N−2, a final flash stage and a digital error correction circuit, the new ADC comprises one more sub-converter stage N−1 and an extra control clock generator. In the new ADC, the input of stage-1 is the output of the sample-and-hold, and the outputs of sample-and-hold and stage-1 are the two inputs of stage-2. At least one of the other sub-converter stages from stage-3 to stage N−1 has two different inputs, and for any stage i with two different inputs, one of the two inputs is the output of stage i−1 and the other is the output of stage i−2. The input(s) of final flash stage is the output of stage N−1 or the outputs of stage N−2 and stage N−1, respectively. The control clock generator is connected with the sample-and-hold, the sub-converter stages from stage-1 to stage N−1 and the flash stage, and receives the clock input to produce sub-clocks with suitable timing phases to control the operations of those circuit blocks. The sub-converter stages from stage-1 to stage N−1 and the flash stage are connected with the digital error correction circuit. Here, N is used to define the resolution of the ADC which can be any integer larger than 2. If sub-converter stage N−1 has only a normal conversion mode, the input of final flash stage is the output of stage N−1. When sub-converter stage N−1 comprises a calibration mode besides the normal conversion mode, the final flash stage has two inputs which are the outputs of stage N−2 and stage N−1, respectively, and the output of stage N−1 is valid if stage N−1 is in the normal conversion mode, or the output of stage N−2 is valid if stage N−1 is in the calibration mode.

The above pipelined ADC may have the following circuit architecture that the sub-converter stage-1 and at least one of sub-converter stages from stage-2 to stage N−1 comprise the aforementioned sub-converter circuit and as a result have two operation modes: normal conversion mode and calibration mode. Those stages with two operation modes are controlled by clock timing phases to be in calibration mode by turns, guaranteeing that N−2 sub-converter stages are always in normal pipeline conversion mode which means a quasi real-time calibration periodically without interrupting the normal conversion.

The above pipelined ADC may also have the following circuit architecture that the sub-converter stage-2 and at least one of sub-converter stages from stage-3 to stage N−1 comprise two inputs. Those stages with two inputs incorporate a switch unit to select one of the two inputs to be valid. The output of sub-converter stage-1 is selected to be valid as the input of stage-2 if stage-1 is in normal conversion mode, and the output of sample-and-hold is selected to be valid as the input of stage-2 if stage-1 is in calibration mode. For the sub-converter stages from stage-3 to stage N−1, the output of stage i−1 is selected to be valid as the input of stage i if stage i−1 is in normal conversion mode, and the output of stage i−2 is selected to be valid as the input of stage i if stage i−1 is in calibration mode.

In the above pipelined ADC, the sub-converter stages with two operation modes may share one error detector for saving chip area and power.

In the pipelined ADC with the present invention technique, one-stage low-gain architecture can be adopted for the amplifier and the choice of capacitor is insensitive to mismatch (only limited by kT/C noise). As a result, performance improvements are significant in conversion rate, power consumption, and chip area.

BRIEF DESCRIPTION OF THE DRAWINGS

FIG. 5A is a circuit diagram illustrating a 1.5-bit sub-converter of the exemplary embodiment in sampling phase of the normal conversion mode.

FIG. 5B is a circuit diagram illustrating a 1.5-bit sub-converter of the exemplary embodiment in holding phase of the normal conversion mode.

FIG. 5C is a circuit diagram illustrating a 1.5-bit sub-converter of the exemplary embodiment in sampling phase of the calibration mode.

FIG. 5D is a circuit diagram illustrating a 1.5-bit sub-converter of the exemplary embodiment in holding phase of the calibration mode.

DETAILED DESCRIPTION OF THE INVENTION

Figure 1:
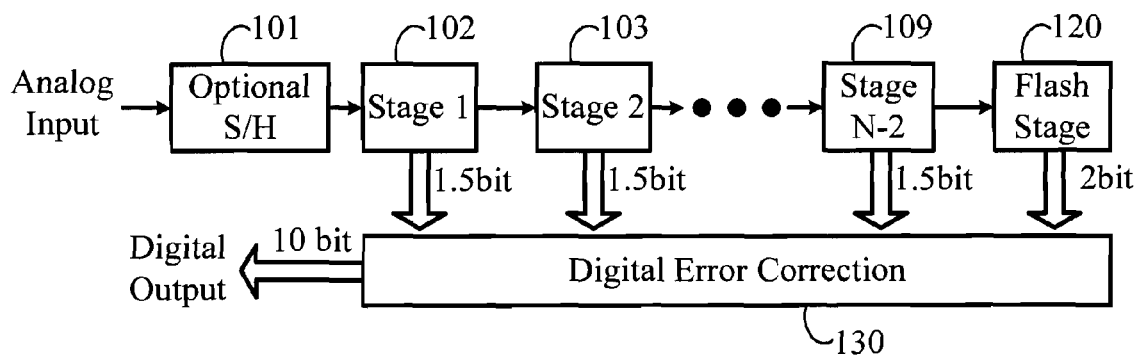
FIG. 1 is a schematic diagram of a conventional pipelined ADC with 1.5-bit/stage architecture.
Figure 4:
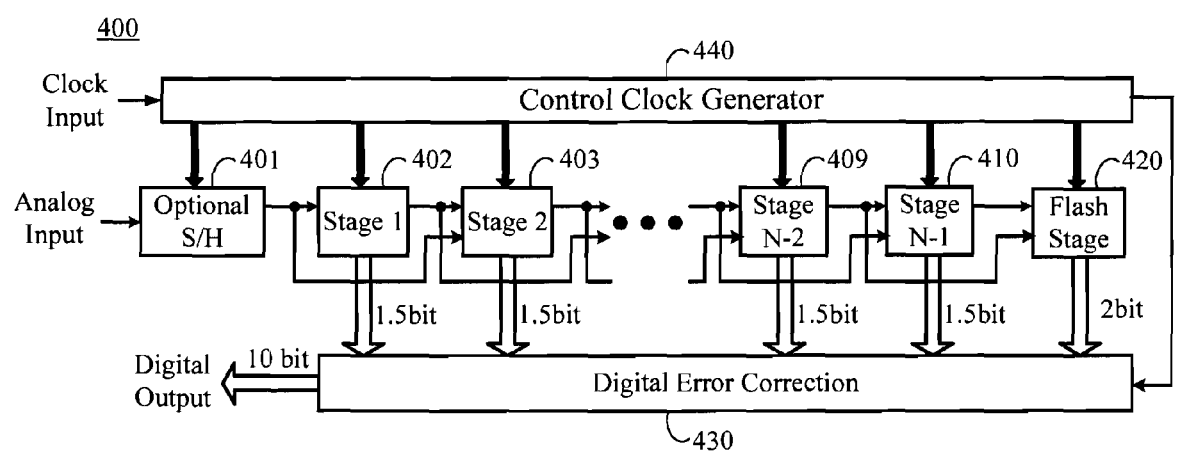
FIG. 4 is a schematic diagram of a 1.5-bit/stage pipelined ADC in accordance to a preferred embodiment of the present invention.

According to the present invention, a block diagram of the embodiments is shown in FIG. 4, where the pipelined ADC is with a 1.5-bit/stage architecture and the resolution is, for example, 10 bits (N=10). Comparing with the conventional ADC 100 illustrated in FIG. 1, the new ADC 400 comprises one more sub-converter stage 410 and an extra control clock generator 440. The control clock generator 440 receives the clock input and produces suitable timing phases to control the operations of optional sample-and-hold 401, sub-converter stages 402-410, final flash stage 420 and digital error correction circuit 430. Conventionally, eight sub-converter stages are needed for a 10-bit pipeline ADC, besides the last 2-bit flash one. In this structure, nine stages 402-410 are utilized in order to perform the calibration task periodically.

In FIG. 4, the input of stage-1 402 is the output of optional sample-and-hold 401 which receives the analog input signal. The outputs of sample-and-hold 401 and stage-1 402 are the two inputs of stage-2 403. At least one of the other sub-converter stages from stage-3 404 to stage N−1 410 has two different inputs, and for any stage i with two different inputs, one of the two inputs is the output of stage i−1 and the other is the output of stage i−2. The input(s) of final flash stage 420 is the output of stage N−1 410 or the outputs of stage N−2 409 and stage N−1 410, respectively. The control clock generator 440 is connected with sample-and-hold 401, sub-converter stages from stage-1 402 to stage N−1 410 and flash stage 420, and receives clock input to produce suitable clock timing phases to control the operations of those circuit blocks. Sub-converter stages from stage-1 402 to stage N−1 410 and flash stage 420 are connected with the digital error correction circuit 430. Here, N is used to define the resolution of the ADC which can be any integer larger than 2.

If sub-converter stage N−1 410 is with only normal conversion mode, the input of final flash stage 420 is the output of stage N−1 410. When sub-converter stage N−1 410 comprises a calibration mode besides the normal conversion mode, the final flash stage 420 has two inputs which are the outputs of stage N−2 409 and stage N−1 410, respectively, and the output of stage N−1 410 is valid if stage N−1 410 is in normal conversion mode, or the output of stage N−2 409 is valid if stage N−1 410 is in calibration mode.

In this structure, N−1 stages 402-410 are utilized in order to perform the calibration task periodically. The sub-converter stage-1 402 and at least one of sub-converter stages from stage-2 403 to stage N−1 410 have two operation modes: normal conversion mode and calibration mode. Those stages with two operation modes are controlled by clock timing phases to be in calibration mode by turns, guaranteeing that N−2 sub-converter stages are always in normal pipeline conversion mode which means a quasi real-time calibration periodically without interrupting the normal conversion. Those stages with two operation modes operate as follows. At first, stage-1 402 is removed from the pipeline for calibration. When calibration finishes, stage-1 402 joins back to the pipeline and stage-2 403 is removed in the same way, and so on. After the last stage is calibrated, the process repeats again.

Figure 2A:
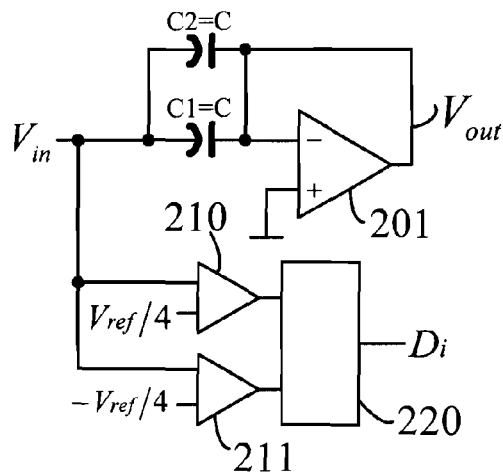
FIG. 2A is a circuit diagram of a conventional 1.5-bit sub-converter in the sampling phase.
Figure 2B:
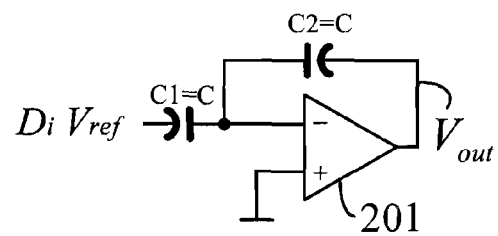
FIG. 2B is a circuit diagram of a conventional 1.5-bit sub-converter in the holding phase.
Figure 3:
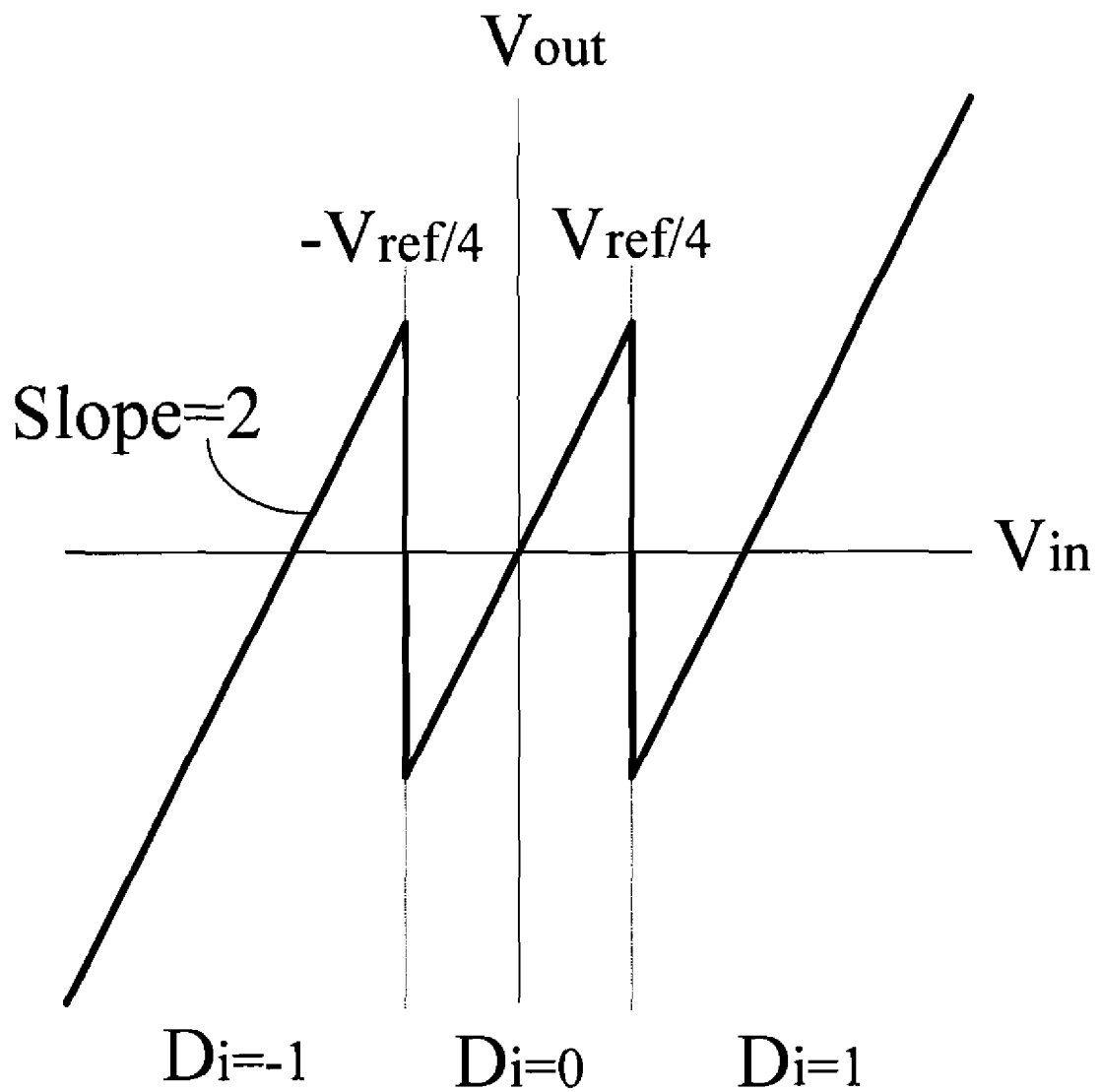
FIG. 3 is the quantization graph of input analog voltage in a conventional 1.5-bit sub-converter.

FIG. 5A, FIG. 5B, FIG. 5C and FIG. 5D show schematic diagrams of a sub-converter stage. The sub-converter stage-2 and at least one of sub-converter stages from stage-3 to stage N−1 comprise two inputs, and those stages with two inputs have a little difference with conventional stages shown in FIG. 2A and FIG. 2B. Because there are two analog inputs $V_{in1}$ and $V_{in2}$ during sampling phase in the sub-converter stage, a switch unit 530 is incorporated before amplifier 501 and comparators 510 and 511. For details, the sub-converter stage with two inputs comprises an amplifier 501, two capacitors C1 and C2, two comparators 510 and 511, a digital unit 520, a switch unit 530, and a memory 540, as illustrated in FIG. 5A. The voltage Vctr stored in the memory 540 is used for adjusting the gain of the amplifier 501. In sampling phase, one of the two analog inputs $V_{in1}$ and $V_{in2}$ is selected by switch unit 530 to be valid. The output of sub-converter stage-1 402 is selected to be valid as the input of stage-2 403 if stage-1 402 is in normal conversion mode, and the output of sample-and-hold 401 is selected to be valid as the input of stage-2 403 if stage-1 402 is in calibration mode. For the sub-converter stages from stage-3 404 to stage N−1 410, the output of stage i−1 is selected to be valid as the input of stage i if stage i−1 is in normal conversion mode, and the output of stage i−2 is selected to be valid as the input of stage i if stage i−1 is in calibration mode. The sub-converter stage-1 402 has no such a switch unit. The input analog signal of sub-converter stage-1 402 is connected directly with the bottom plate of C1 and also fed to the two comparators 510 and 511.

Conventionally, two capacitors are used for input sampling. In this present architecture, only one capacitor C1=2C with an approximately double value as that of C2=C−ΔC is adopted for input sampling, as shown in FIG. 5A. During the sampling phase, the input analog signal is connected with the bottom plate of C1 and C2 is reset (shorted to a dc voltage, for example, ground). The output and inverting input of amplifier 501 are connected together with the top plates of both C1 and C2. The two comparators 510-511 and digital unit 520 operate similarly as those in conventional sub-converter stages.

During the holding phase, as shown in FIG. 5B, the amplifier 501 is in amplification mode and its inverting input is still connected with the top plates of both C1 and C2. The bottom plate of C2 is connected with the output of amplifier 501. Depending on the value of $D_i$ (−1, 0 or 1), the bottom plate of C1 is connected with different reference signals $$-\frac{V_{ref}}{2},$$

0, or $$\frac{V_{ref}}{2},$$

In this phase, we obtain the output $V_{out}$ as $$V_{out} = \frac{2V_{in} + D_i V_{ref}}{1 - \frac{\Delta C}{C} + \frac{3 - \Delta C/C}{A}} \quad (2)$$

Here, $V_{in}$ is the effective input analog signal during the sampling phase and A is the dc gain of amplifier 501. ΔC is capacitance mismatch (error). If customized values of ΔC/C and A are selected to make the following expression stand $$1 - \frac{\Delta C}{C} + \frac{3 - \Delta C/C}{A} = 1 \quad (3)$$

which is the same with (1), i.e., the condition that dc gain and capacitors must satisfy, the new expression of (2) is $$V_{out} = 2V_{in} + D_i V_{ref} \quad (4)$$

Here the input signal is multiplied by two accurately which is perfect for the 1.5-bit/stage pipelined ADC. This means that the finite amplifier gain error and capacitor mismatch error are compensated each other, resulting in an error-free sub-converter stage.

One problem in the preferred embodiment of this invention is that the capacitance ratio $\Delta C/C$ is inconstant due to the imperfection of manufacture process. Therefore, the dc gain A of amplifier must be tunable to adapt to the capacitance ratio, as illustrated in FIG. 5C and FIG. 5D which show schematic diagrams of a sub-converter stage in calibration mode according to a preferred embodiment of the present invention. In the sampling phase of calibration mode, a reference signal $V_{ref}/2$ is sampled on C1, and C2 is reset (the bottom plate is connected to a dc voltage, for example, ground), as shown in FIG. 5C. Here, the amplifier 501 and two capacitors C1 and C2 are the same as those in FIG. 5A. In the holding phase of the calibration mode, the bottom plate of C1 is connected with a dc voltage, for example, ground, and C2 turns to be the feedback capacitor, as shown in FIG. 5D. The output $V_{rout}$ of amplifier 501 is expressed as $$V_{rout} = \frac{V_{ref}}{1 - \frac{\Delta C}{C} + \frac{3 - \Delta C/C}{A}} \quad (5)$$

Here, A is the dc gain of amplifier 501.

In FIG. 5D, the error detector 550 senses the difference between $V_{rout}$ and reference signal $V_{ref}$. The output of the error detector 550 is stored in the memory 540 for adjusting the gain of the amplifier 501. The dc gain of error detector 550 is designed to be very high. Consisting of amplifier 501, error detector 550, capacitors C1 and C2, and memory 540, the closed loop settles with $V_{rout}$ being equal to $V_{ref}$ which means the above expression (3) stands. As a result, the dc gain A of amplifier 501 is customized perfectly to make the finite amplifier gain error and capacitor mismatch compensated each other. Furthermore, sub-converter stages with two operation modes among stages 402-410 can share one error detector 550 for saving power and chip area.

The embodiments of the invention are exemplary and are described in detail to enable those skilled in the art to practice the implementation. It is to be understood that numerous modifications, variations and rearrangements can be readily made to achieve substantially equivalent results, without departing from the spirit or scope of the invention as defined in the appended claims.

[1]. U.S. Pat. No. 6,184,809, Texas Instruments Incorporated (inventor: P. C. Yu), "User transparent self-calibration technique for pipelined ADC architecture".

[2]. U.S. Pat. No. 7,233,276, Himax Technologies Incorporated (inventor: C. H, Huang), "Pipelined analog to digital converter with capacitor mismatch compensation".

[3]. U.S. Pat. No. 6,784,814, University of Minnesota (inventors: K. Nair and R. Harjani), "Correction for pipelined analog to digital (A/D) converter".

[4]. U.S. Pat. No. 6,563,445, Analog Devices Incorporated (inventor: F. Sabouri), "Self-calibration methods and structures for pipelined analog-to-digital converters".

[5]. U.S. Pat. No. 6,232,898, Texas Instruments Incorporated (inventor: K. Nagaraj), "Digital self-calibration scheme for a pipelined A/D converter".

What is claimed is:

1. A sub-converter stage for a pipelined analog-to-digital converter, comprising:
    an amplifier with a dc gain A;
    a sub analog-to-digital converter with comparators and a digital unit;
    a first capacitor with capacitance 2C, the first capacitor is selectively connected between an analog input node and an input of the amplifier or between a corresponding plurality of digital reference signals and the input of the amplifier;
    a second capacitor with capacitance $C-\Delta C$, wherein $\Delta C$ is the capacitance mismatch, the second capacitor is selectively connected between a dc voltage and the input of the amplifier or between the input of the amplifier and an output of the amplifier;
    the dc gain A of the amplifier satisfies with an equation $$\frac{\Delta C}{C} = \frac{3}{A+1};$$

wherein during a sampling phase, the first capacitor is connected between the analog input node and the input of the amplifier and the second capacitor is connected between a dc voltage and said the input of the amplifier, and during a holding phase, the first capacitor is connected between a corresponding plurality of digital reference signals and the input of the amplifier input and the second capacitor is connected between said the input of the amplifier and the output of the amplifier.

2. The sub-converter stage of claim 1, further comprising an error detector and a memory, wherein the gain of the amplifier is adjustable and the sub-converter stage has two operation modes: normal conversion mode and calibration mode, and
    during a sampling phase of the normal conversion mode, the first capacitor is connected between the analog input node and the input of the amplifier and the second capacitor is connected between a dc voltage and the input of the amplifier, and during a holding phase of the normal conversion mode, the first capacitor is connected between a corresponding plurality of digital reference signals and the input of the amplifier and the second capacitor is connected between the input of the amplifier input and said the output of the amplifier, and
    during a sampling phase of the calibration mode, the first capacitor is connected between a reference signal Vref/2 and the input of the amplifier and the second capacitor is connected between a dc voltage and the input of the amplifier, and during a holding phase of the calibration mode, the first capacitor is connected between a dc voltage and the input of the amplifier and the second capacitor is connected between the input of the amplifier and the output of the amplifier and the difference between output signal of the amplifier and reference signal Vref is detected by the error detector whose output is stored in the memory for adjusting the gain of the amplifier to make the equation $$\frac{\Delta C}{C} = \frac{3}{A+1}$$

still stand even when the capacitance ratio of the first capacitor and the second capacitor drifts in real environment.

3. A pipelined analog-to-digital converter comprising a series of sub-converter stages of claim 1.

4. The pipelined analog-to-digital converter of claim 3, further comprising:
    circuit blocks in conventional pipelined analog-to-digital converter comprising an optional sample-and-hold;
    sub-converter stages from stage-1 to stage N–2;
    a final flash stage;

a digital error correction circuit;
a sub-converter stage N−1, and
a control clock generator;
wherein the input of stage-1 is the output of the sample-and-hold; the outputs of sample-and-hold and stage-1 are the two inputs of stage-2; at least one stage i of the other sub-converter stages from stage-3 to stage N−1 has two different inputs among which one is the output of stage i−1 and the other is the output of stage i−2; the input(s) of final flash stage is the output of stage N−1 or the outputs of stage N−2 and stage N−1, respectively; the control clock generator is connected with the sample-and-hold, the sub-converter stages from stage-1 to stage N−1 and said flash stage, and receives clock input to produce suitable timing phases to control the operations of those said circuit blocks; the sub-converter stages from stage-1 to stage N−1 and said flash stage are connected with the digital error correction circuit; N is used to define the resolution of the ADC which can be any integer larger than 2, and when the sub-converter stage N−1 has only normal conversion mode, the input of the final flash stage is the output of stage N−1; when the sub-converter stage N−1 comprises calibration mode besides normal conversion mode, the final flash stage has two inputs which are the outputs of stage N−2 and stage N−1, respectively, and the output of stage N−1 is valid if stage N−1 is in normal conversion mode, or the output of said stage N−2 is valid if stage N−1 is in calibration mode.

5. The pipelined analog-to-digital converter of claim 4 wherein the sub-converter stage-1 and at least one of said sub-converter stages from stage-2 to stage N−1 comprise the sub-converter circuit of claim 2 and have two operation modes: normal conversion mode and calibration mode, and those stages with two operation modes are controlled by clock timing phases to be in calibration mode by turns, guaranteeing that N−2 sub-converter stages are always in normal pipeline conversion mode which means a quasi real-time calibration periodically without interrupting the normal conversion.

6. The pipelined analog-to-digital converter of claim 4 wherein the sub-converter stage-2 and at least one of said sub-converter stages from stage-3 to stage N−1 comprise two inputs, and those stages with two inputs incorporate a switch unit to select one of the two inputs to be valid, and the output of sub-converter stage-1 is selected to be valid as the input of stage-2 if stage-1 is in normal conversion mode, and the output of said sample-and-hold is selected to be valid as the input of stage-2 if stage-1 is in calibration mode, and the output of stage i−1 is selected to be valid as the input of stage i among said sub-converter stages from stage-3 to stage N−1 if stage i−1 is in normal conversion mode, and the output of stage i−2 is selected to be valid as the input of stage i among said sub-converter stages from stage-3 to stage N−1 if stage i−1 is in calibration mode.

7. The pipelined analog-to-digital converter of claim 5 wherein the sub-converter stages with two operation modes share one error detector for saving chip area and power.

* * * * *